(12) United States Patent
Sjöland (10) Patent No.: US 9,281,785 B2
(45) Date of Patent: Mar. 8, 2016

(54) LOW-NOISE AMPLIFIER, RECEIVER, METHOD AND COMPUTER PROGRAM

(75) Inventor: Henrik Sjöland, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 40 days.

(21) Appl. No.: 14/236,972

(22) PCT Filed: Jul. 10, 2012

(86) PCT No.: PCT/EP2012/063486
§ 371 (c)(1),
(2), (4) Date: Mar. 6, 2014

(87) PCT Pub. No.: WO2013/020768
PCT Pub. Date: Feb. 14, 2013

(65) Prior Publication Data
US 2014/0203872 A1    Jul. 24, 2014

Related U.S. Application Data (60) Provisional application No. 61/525,965, filed on Aug. 22, 2011.

(30) Foreign Application Priority Data

Aug. 11, 2011    (EP) ..................................... 11177281

(51) Int. Cl.
| | |
|---|---|
| *H03F 1/56* | (2006.01) |
| *H03F 3/19* | (2006.01) |
| *H03F 3/45* | (2006.01) |
| *H03F 1/30* | (2006.01) |
| *H03F 3/193* | (2006.01) |

(52) U.S. Cl.
CPC .................. *H03F 1/56* (2013.01); *H03F 1/303* (2013.01); *H03F 3/19* (2013.01); *H03F 3/193* (2013.01); *H03F 3/45071* (2013.01); *H03F 3/45098* (2013.01); *H03F 3/45183* (2013.01);
(Continued)

(58) Field of Classification Search
USPC ................................................... 330/252–261
See application file for complete search history.

(56) References Cited

U.S. PATENT DOCUMENTS

| | | | |
|---|---|---|---|
| 6,542,019 | B1 | 4/2003 | Lim et al. |
| 6,566,949 | B1 | 5/2003 | Park |

(Continued)

FOREIGN PATENT DOCUMENTS

EP    0652635 A1    5/1995

OTHER PUBLICATIONS

Zhuo, W., et al., "A Capacitor Cross-Coupled Common-Gate Low-Noise Amplifier," IEEE Transactions on Circuits and Systems II: Express Briefs. Dec. 12, 2005. pp. 875-879. vol. 52, Issue 12.
(Continued)

*Primary Examiner* — Hieu Nguyen
(74) *Attorney, Agent, or Firm* — Murphy, Bilak & Homiller, PLLC (57) ABSTRACT

A differential cross-coupled common-source or common-emitter low-noise amplifier having capacitive degeneration is disclosed. Further, a radio receiver comprising such a low-noise amplifier is disclosed. Further, a method of controlling switched capacitive networks of an amplifier is disclosed. The method comprises controlling capacitances of the switched degeneration capacitor networks and/or the switched cross-coupling capacitor networks. Further, a computer program for implementing the method is disclosed.

13 Claims, 6 Drawing Sheets

(52) U.S. Cl.
CPC ...... *H03F3/45197* (2013.01); *H03F 2200/222* (2013.01); *H03F 2200/294* (2013.01); *H03F 2200/447* (2013.01); *H03F 2200/451* (2013.01); *H03F 2200/468* (2013.01); *H03F 2203/45458* (2013.01); *H03F 2203/45461* (2013.01); *H03F 2203/45464* (2013.01); *H03F 2203/45488* (2013.01); *H03F 2203/45544* (2013.01); *H03F 2203/45554* (2013.01); *H03F 2203/45562* (2013.01); *H03F 2203/45622* (2013.01); *H03F 2203/45638* (2013.01); *H03F 2203/45702* (2013.01)

(56) References Cited

U.S. PATENT DOCUMENTS

| | | |
|---|---|---|
| 7,256,646 B2 | 8/2007 | Eid et al. |
| 2002/0113605 A1 | 8/2002 | De Maaijer et al. |
| 2006/0088086 A1* | 4/2006 | Gondi et al. ............... 375/229 |
| 2006/0284670 A1 | 12/2006 | Eid et al. |
| 2008/0211580 A1 | 9/2008 | Bollati et al. |
| 2010/0039174 A1 | 2/2010 | Teetzel |

OTHER PUBLICATIONS

Sjöland, H., "Improved Switched Tuning of Differential CMOS VCOs," IEEE Transactions on Circuits and Systems II: Analog and Digital Signal Processing; IEEE RFIC Virtual Journal; 2002; pp. 352-355; vol. 49, Issue 5.

Fan, X., et al., "A Noise Reduction and Linearity Improvement Technique for a Differential Cascode LNA," IEEE Journal of Solid-State Circuits. Mar. 2008. pp. 588-599. vol. 43, Issue 3.

* cited by examiner

Prior Art

Fig. 10

Prior Art

LOW-NOISE AMPLIFIER, RECEIVER, METHOD AND COMPUTER PROGRAM

TECHNICAL FIELD

The present invention generally relates to a low-noise amplifier, to a radio receiver comprising such an amplifier, a method of controlling switched capacitive networks of an amplifier, and to a computer program for implementing the method.

BACKGROUND

To achieve good noise performance of a radio receiver, e.g. used for cellular communication in a mobile terminal or base station, it is desirable to have a low-noise amplifier (LNA) with high gain and low noise. This enables reception of very weak signals. A further demand on the LNA is sufficient linearity to be able to handle interfering signals, and it is also desirable that good input power match is provided that is a well defined resistive input impedance to ensure proper operation of preceding elements such as band select or duplex filter.

Figure 10:
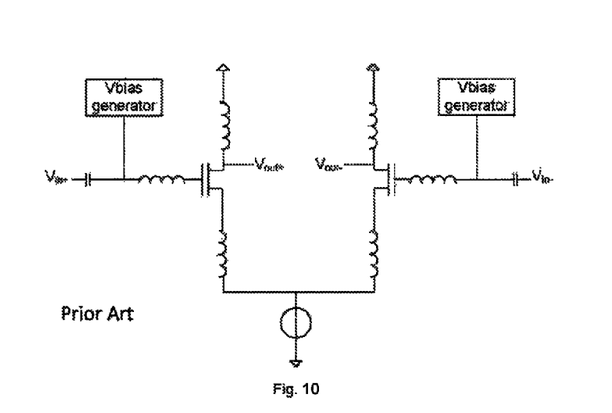
FIG. 10 illustrates an inductively degenerated amplifier according to conventional art.

To provide input power match and simultaneously achieve the low-noise properties, inductive series degeneration has been used. An example of an amplifier using this is illustrated in FIG. 10. A drawback of this solution, in addition to its inflexibility in design, is the large area occupied by on-chip inductors, or the alternative demand of expensive and volume consuming external inductors. Further examples according to this principle are disclosed in US 2006/0284670.

Figure 11:
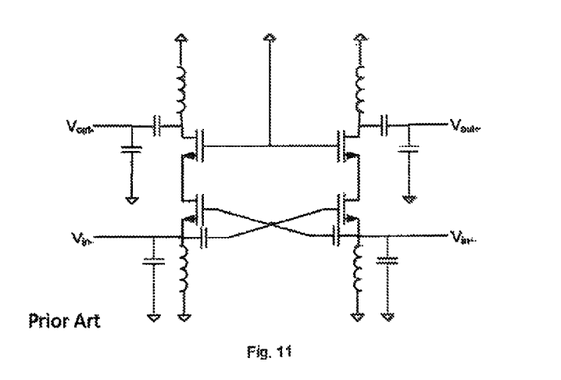
FIG. 11 illustrates a common-gate amplifier according to conventional art.

Another approach is to use a common-gate LNA, which enables wider bandwidth operation and less inductors compared to the approach described with reference to FIG. 10. An example of this approach is illustrated in FIG. 11. The approach is further described in Zhuo et al., "A Capacitor Cross-Coupled Common-Gate Low-Noise-Amplifier", IEEE Trans. on Circuits and Systems, Vol 52, No. 12, 2005. However, the nature of a common-gate LNA is that the low-noise properties of the inductively degenerated approach described with reference to FIG. 10 cannot be achieved. The common-gate LNA is therefore not considered a suitable choice for demanding implementations, such as use in mobile terminals where both low-noise properties and low power consumption are required.

It is therefore a desire to provide an amplifier suitable for such demanding implementations.

SUMMARY

An object of the invention is to at least alleviate the above stated problem. The present invention is based on the understanding that the similar properties as of the inductively degenerated amplifier in sense of noise figures is possible in a cross-coupled common-source or common-emitter amplifier by using capacitive degeneration. Capacitors are less demanding in sense of on-chip space. The capacitive degeneration gives, for the case of a cross-coupled common-source or common-emitter amplifier, the similar possibilities for matching input impedance as the inductive degeneration topology, and the inventor has further found that the additional advantage of enabling flexibility by using variable capacitances, e.g. by a switched capacitor network, gives the possibility to adapt on-chip solutions to a variety of situations.

According to a first aspect, there is provided a differential cross-coupled common-source or common-emitter low-noise amplifier having capacitive degeneration.

The amplifier may comprise a first capacitive cross coupling from gate or base of a first input transistor to source or emitter of a second input transistor, and a second capacitive cross coupling from gate or base of the second input transistor to source or emitter of the first input transistor. The amplifier may further comprise a first capacitive degeneration circuit operatively connected to source or emitter of the first input transistor; and a second capacitive degeneration circuit operatively connected to source or emitter of the second input transistor. The amplifier may alternatively or additionally comprise a differential capacitive degeneration circuit operatively connected between source or emitter of the first input transistor and source or emitter of the second input transistor. The properties of the capacitive cross couplings and the capacitive degeneration circuits are essentially capacitive at a working frequency of the amplifier. The first and second capacitive degeneration circuits and/or differential capacitive degeneration circuit may each comprise a switched degeneration capacitor network. The first and second capacitive cross couplings may each comprise a switched cross-coupling capacitor network.

The amplifier may further comprise a control unit arranged to control capacitances of the switched degeneration capacitor networks and/or the switched cross-coupling capacitor networks. The control unit may be arranged to control the capacitances such that input impedance of the amplifier is adapted to external circuitry connected to the input of the amplifier. Alternatively or additionally, the control unit may be arranged to control the capacitances such that input impedance of the amplifier is maintained by compensating for any of circuit manufacturing process variations, supply voltage variations, bias current variations, and temperature variations of the amplifier. Alternatively or additionally, the control unit may be arranged to control the capacitances such that input impedance of the amplifier is adapted to working frequency of the amplifier.

According to a second aspect, there is provided a radio receiver comprising a low-noise amplifier according to the first aspect.

According to a third aspect, there is provided a method of controlling switched capacitive networks of an amplifier according to embodiments of the first aspect. The method comprises controlling capacitances of the switched degeneration capacitor networks and/or the switched cross-coupling capacitor networks.

The controlling of the capacitances may be performed such that input impedance of the amplifier is adapted to external circuitry connected to the input of the amplifier. Alternatively or additionally, the controlling of the capacitances may be performed such that input impedance of the amplifier is maintained by compensating for any of circuit manufacturing process variations, supply voltage variations, bias current variations, and temperature variations of the amplifier. Alternatively or additionally, the controlling of the capacitances may be performed such that input impedance of the amplifier is adapted to working frequency of the amplifier.

According to a fourth aspect, there is provided a computer program comprising instructions, which when executed by a processor of a radio receiver according to second aspect, cause the radio receiver to perform control according to the third aspect.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

Figure 1:
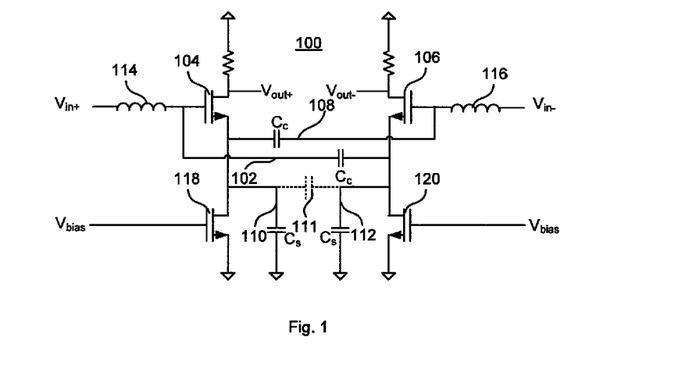
FIG. 1 illustrates a differential cross-coupled common-source amplifier having capacitive degeneration according to an embodiment.
Figure 2:
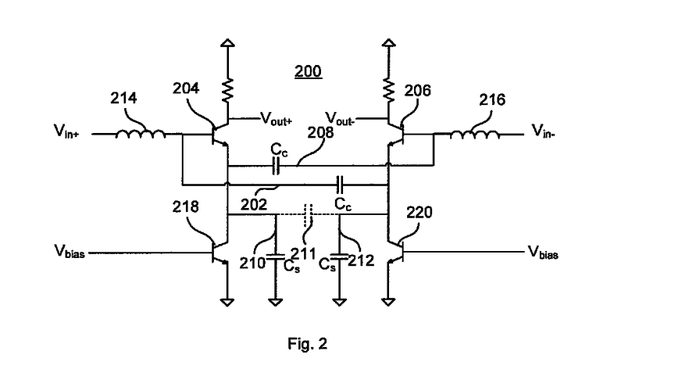
FIG. 2 illustrates a differential cross-coupled common-emitter amplifier having capacitive degeneration according to an embodiment.

FIG. 1 is a circuit diagram illustrating a differential cross-coupled common-source low-noise amplifier 100 having capacitive $C_s$ degeneration. FIG. 2 is a circuit diagram illustrating a differential cross-coupled common-emitter low-noise amplifier 200 having capacitive $C_s$ degeneration. The idea is to apply capacitive source degeneration instead of inductive. Normally that would result in a negative real part of the input impedance, as the impedance of a capacitor is reactive, like that of an inductor, but has the opposite sign, i.e. negative. This means that the signal voltage at the source or emitter node has the opposite phase, compared to what is needed to create a positive real part of the input impedance. In a differential amplifier thus the signal at the opposite side has the correct phase. The idea of the invention is therefore to put a capacitive cross coupling larger than the transistor intrinsic $C_{gs}$ or $C_{ce}$ to the opposite side source or emitter node. The signal current in the cross coupling capacitor will then dominate over $C_{gs}$ or $C_{ce}$, and a net positive real part of the impedance results. Introducing an additional capacitance in addition to the intrinsic gate source capacitance is beneficial in overcoming the gate induced noise, and results in improved noise performance. Similar applies for the bipolar case. Preferably, the additional capacitance is provided by parallel plate capacitor or other type that provides good linearity, low loss, and fairly accurate capacitance in the process used when integrating the capacitances on a chip of the low-noise amplifier.

Considering the illustrated circuits of FIGS. 1 and 2, a first capacitive $C_c$ cross coupling 102, 202 from gate or base of a first input transistor 104, 204 to source or emitter of a second input transistor 106, 206, and a second capacitive $C_c$ cross coupling 108, 208 from gate or base of the second input transistor 106, 206 to source or emitter of the first input transistor 104, 204 are provided. Further, a first capacitive $C_s$ degeneration circuit 110, 210 is operatively connected to source or emitter of the first input transistor 104, 204, and a second capacitive $C_s$ degeneration circuit 112, 212 is operatively connected to source or emitter of the second input transistor 106, 206. Additionally or alternatively, a differential degeneration circuit 111, 211 is operatively connected between source or emitter of the first input transistor 104, 204 and source or emitter of the second input transistor 106, 206. The properties of the capacitive cross couplings 102, 108, 202, 208 and the capacitive degeneration circuits 110, 111, 112, 210, 211, 212 are essentially capacitive at a working frequency of the amplifier 100, 200. Thus, further elements may be present in the circuits as illustrated in FIGS. 1 and 2, but the above demonstrated properties should still be essentially capacitive at the working frequency, which is to be considered at the design of the low-noise amplifier.

By using a capacitive degeneration instead of an inductive, the area occupied by source inductors can be reduced. However, note that gate or base inductors 114, 116, 214, 216 are still used, just like in a traditional inductively degenerated amplifier, to make the reactive part of the input impedance small at the frequencies of operation. That is, it should resonate with the capacitances of the structure, creating essentially real input impedance.

The amplifier further comprises biasing circuitry, which can comprise anything from a fixed resistor to a fairly complex circuitry for controlling biasing. In FIGS. 1 and 2, the biasing circuitry is represented by transistors 118, 120, 218, 220 which are controlled by a voltage $V_{bias}$ to provide desired biasing.

Further, the loads for providing swing to the output signal are depicted as resistors, but can of course be other elements, as is known in the art. A cascode arrangement can also be provided, e.g. to reduce local oscillator leakage.

Figure 3:
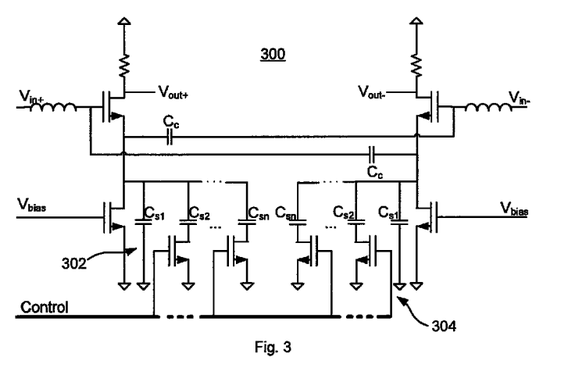
FIG. 3 illustrates a differential cross-coupled common-source amplifier having programmable capacitive degeneration according to an embodiment.
Figure 7:
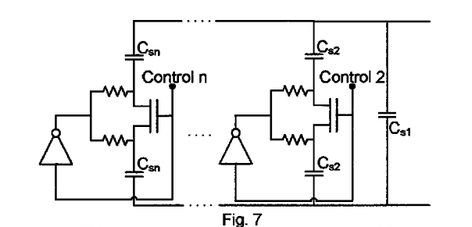
FIG. 7 illustrates an alternative way of providing a differential switched capacitor network suitable for capacitive degeneration.

FIG. 3 illustrates a differential cross-coupled common-source amplifier 300 having programmable capacitive degeneration according to an embodiment. Except for the programmable capacitive degeneration circuitry, the amplifier 300 resembles the amplifier 100 presented above with reference to FIG. 1. The capacitive degeneration is made programmable by the first and second capacitive degeneration circuits each comprising a switched degeneration capacitor network 302, 304. The switched capacitive networks 302, 304 can be designed according to one of several known principles for switched capacitive networks where different amounts of capacitors of a capacitor bank are connected by switches to form an aggregate capacitance. The illustrated capacitor networks 302, 304 each comprises a first capacitor $C_{s1}$ which is always connected, and a plurality of capacitors $C_{s2}$-$C_{sn}$ which each are connected in series with a controlled switch such that they can be switched in to be in parallel with the first capacitor $C_{s1}$, and where n is the number of capacitors in each capacitor network. Alternatively, a differential switched capacitive network as illustrated in FIG. 7 can be used, which is further demonstrated with reference to the embodiment depicted in FIG. 12.

Figure 4:
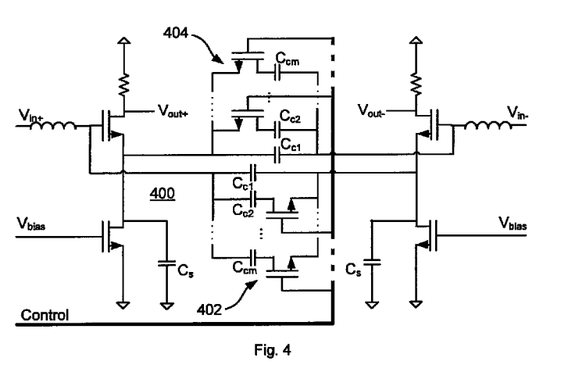
FIG. 4 illustrates a differential cross-coupled common-source amplifier having capacitive degeneration and programmable cross-coupling according to an embodiment.

FIG. 4 illustrates a differential cross-coupled common-source amplifier 400 having capacitive degeneration and programmable cross-coupling according to an embodiment. Except for the programmable capacitive cross-coupling circuitry, the amplifier 400 resembles the amplifier 100 presented above with reference to FIG. 1. The capacitive cross-coupling is made programmable by the first and second capacitive cross-coupling circuits each comprising a switched cross-coupling capacitor network 402, 404. Similar to the switched capacitor networks 302, 304 for programmable degeneration demonstrated with reference to FIG. 3, the switched capacitor networks 402, 404 can be designed in several ways, where a first cross-coupling capacitor $C_{c1}$, which is always keeping the cross-coupling, can be added up with a number of capacitors $C_{c2}$-$C_{cm}$ which are by switching connected in parallel with the first cross-coupling capacitor $C_{c1}$, where m is the number of capacitors in each capacitor network.

Figure 5:
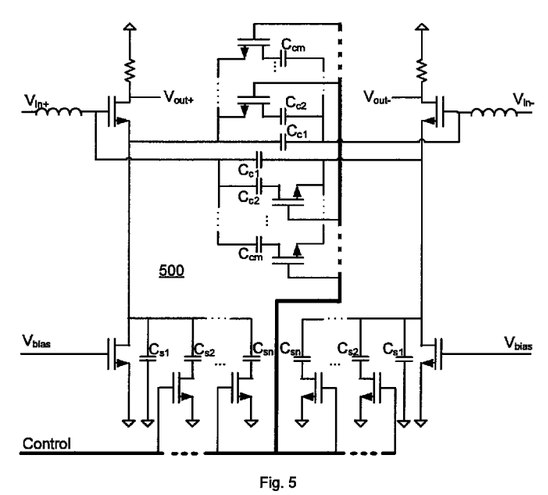
FIG. 5 illustrates a differential cross-coupled common-source amplifier having programmable capacitive degeneration and programmable cross-coupling according to an embodiment.

FIG. 5 illustrates a differential cross-coupled common-source amplifier 500 having programmable capacitive degeneration and programmable cross-coupling according to an embodiment. The combined features of the programmable capacitive degeneration as demonstrated with reference to FIG. 3 above and the programmable capacitive cross-coupling as demonstrated with reference to FIG. 4 above are thus provided. The structure of the programmable capacitive networks can be similar to what has been demonstrated with reference to FIGS. 3 and 4, and for the switched capacitive degeneration network, the configuration demonstrated with reference to FIG. 7 can be used as alternative, or additionally.

The amplifier as demonstrated with reference to FIGS. 3 to 5 can comprise a control unit arranged to control capacitances of the switched degeneration capacitor networks and/or the switched cross-coupling capacitor networks. The control unit can then be arranged to control the capacitances such that input impedance of the amplifier is adapted to external circuitry connected to the input of the amplifier, and/or such that input impedance of the amplifier is maintained by compensating for any of circuit manufacturing process variations, supply voltage variations, bias current variations, and temperature variations of the amplifier. The control unit can also be arranged to control the capacitances such that input impedance of the amplifier is adapted to working frequency of the amplifier.

A further advantage that can be achieved by the programmability is by saving power when the full dynamic range of the amplifier is not needed. The bias current can then be reduced, resulting in reduced transconductance $g_m$. If then the degeneration capacitance is reduced at the same time the input impedance can be maintained. It should also be noted that if the degeneration capacitance could be almost completely removed, still a resistive input impedance would be achieved. The real part in that case is produced by the $g_m$ of the opposite side transistor. The opposite side transistor can be seen as a common gate stage, to the input of which the cross coupling capacitor is connected, and the common gate stage has a resistive part of its input impedance. The cross coupling results in a halved input impedance, $R_{in}=1/(2g_m)$. This sets the limit to how small $g_m$ can be made, and still achieve a good input match. It should also be noted that the noise performance in this mode more resembles that of a common gate stage than of an inductively source degenerated one. When using a substantial degeneration capacitance combined with an appropriate bias current, the amplifier on the other hand reaches a similar noise performance as an inductively degenerated one.

According to calculations, the real part of the input impedance $R_{in}$ is $$R_{in}=g_m(C_s+2C_c)/(C_c(\omega^2 C_s^2+4g_m^2))$$

where $g_m$ is transconductance, $C_s$ is the degeneration capacitance and $C_c$ the cross coupling capacitance, and $\omega$ is the angular frequency. When $C_s$ is large so that its admittance is much larger than transconductance $g_m$, it will dominate the source node admittance. If degradation capacitance $C_s$ is also much larger than cross-coupling capacitance $C_c$, the expression can be approximated as $$R_{in}\approx g_m/(\omega^2 C_s C_c)$$

If transconductance $g_m$ is reduced to save power, degradation capacitance $C_s$ has to be reduced proportionally. As degeneration capacitance $C_s$ is reduced, the approximation above will no longer be valid, and the limit is reached when the admittance of the degradation capacitance $C_s$ is much smaller than transconductance $g_m$. If degeneration capacitance $C_s$ is then also much smaller than the cross-coupling capacitance $C_c$, the following approximation can be used $$R_{in}\approx 1/(2g_m).$$

This shows that with the here demonstrated approach, the behaviour of the low-noise amplifier can be assigned, either at design of the circuit and/or by controlling switched capacitive networks as demonstrated with reference to any of FIGS. 3, 4, 5 and 7.

Figure 6:
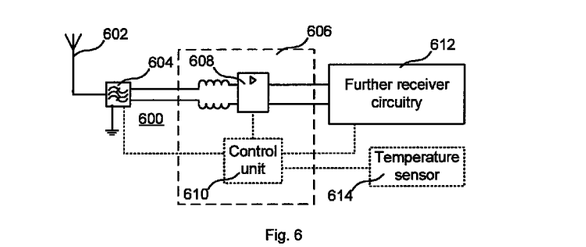
FIG. 6 schematically illustrates a radio receiver according to an embodiment.

FIG. 6 schematically illustrates a radio receiver 600 according to an embodiment. The receiver comprises an antenna arrangement 602 which is arranged to receive signals provided from a remote radio transmitter. The received signals are provided via an input filter arrangement 604 to a low-noise amplifier 606. The low-noise amplifier 606 is arranged according to any of the embodiments demonstrated with reference to FIGS. 1 to 5 and comprises amplifier circuitry 608 and optionally a control unit 610 as demonstrated above, when the amplifier circuitry comprises programmable capacitive networks as demonstrated with reference to FIGS. 3 to 5. The control unit can also be a separate element of the receiver 600, or included in other elements of the receiver 600. The amplified signal is provided to further receiver circuitry 612, such as automatic gain control, analog-to-digital conversion, signal processing, decoding, etc. devices. The control unit can be arranged to for example adapt the amplifier circuitry 608 based on temperature, wherein the receiver 600 preferably comprises a temperature sensor 614 which provides its measurements of the temperature to the control unit 610. The control unit 610 can also be arranged to exchange signals with the input filter arrangement 604 or the further receiver circuitry 612 to adapt the behaviour of the amplifier 608 to work well together with the elements at the input and output of the amplifier 608.

FIG. 7 illustrates an alternative way of providing a switched capacitor network suitable for the capacitive degeneration. By provision of control signals to switch one or more arrangements, the capacitance of the capacitive network can be changed. The features of such differential capacitive network is further described in H. Sjöland, "Improved switched tuning of differential CMOS VCOs", *IEEE Transactions on Circuits and Systems II*, vol. 49, No. 5, pp 352-355, 2002.

Figure 8:
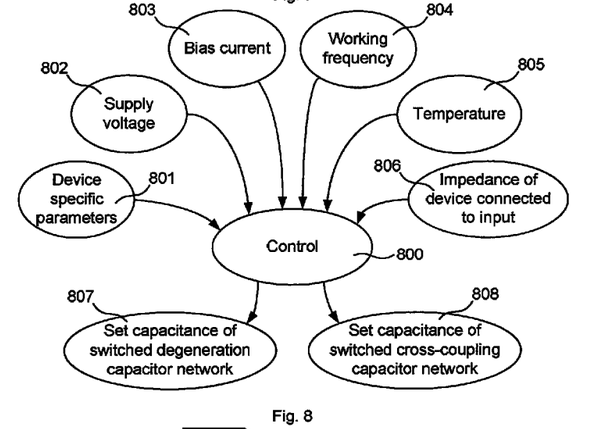
FIG. 8 schematically illustrates a method of controlling switched capacitive networks of an amplifier according to an embodiment.

FIG. 8 schematically illustrates a method of controlling switched capacitive networks of an amplifier according to an embodiment. The procedure is illustrated as different objects 801-806 providing input to a control action 800, which in turn provides control of a degeneration capacitance setting object 807 and/or a cross-coupling capacitance setting object 808. One or more of the input objects 801-806 can be applicable for performing the control 800. The controlling 800 of the capacitances can for example be performed such that input impedance of the amplifier is adapted to external circuitry connected to the input of the amplifier, e.g. the antenna arrangement 602 and/or the input filter arrangement 604 as illustrated in FIG. 6, by device impedance object 806. The controlling 800 of the capacitances can for example be performed such that input impedance of the amplifier is maintained by compensating for any of circuit manufacturing process variations, e.g. given by device specific parameter object 801, supply voltage variations given by supply voltage element 802, bias current variations given by bias current object 803, and temperature variations, given by temperature object 805, of the amplifier. The controlling 800 of the capacitances can be performed such that input impedance of the amplifier is adapted to working frequency, given by working frequency object 804, of the amplifier.

Figure 9:
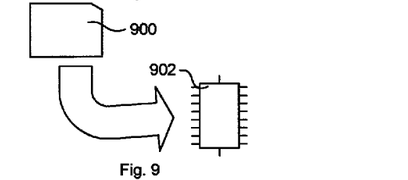
FIG. 9 schematically illustrates a computer-readable medium holding a computer program, which when executed on the illustrated processor causes the processor to perform control e.g. as depicted in FIG. 8.

The methods according to the present invention are suitable for implementation with aid of processing means, such as computers and/or processors, especially for the case where the amplifier is used in a receiver controlled by digital processing means. Therefore, there is provided computer programs, comprising instructions arranged to cause the processing means to perform the steps of any of the methods according to any of the embodiments described with reference to FIG. 8. The computer programs preferably comprises program code which is stored on a computer readable medium 900, as illustrated in FIG. 9, which can be loaded and executed by a processing means, processor, or computer 902 to cause it to perform the methods, respectively, according to embodiments of the present invention, preferably as any of the embodiments described with reference to FIG. 8. The processor 902 and computer program product 900 can be arranged to execute the program code sequentially where actions of the any of the methods are performed stepwise. The processing means, processor, or computer 902 is preferably what normally is referred to as an embedded system. Thus, the depicted computer readable medium 900 and processor 902 in FIG. 9 should be construed to be for illustrative purposes only to provide understanding of the principle, and not to be construed as any direct illustration of the elements.

Figure 12:
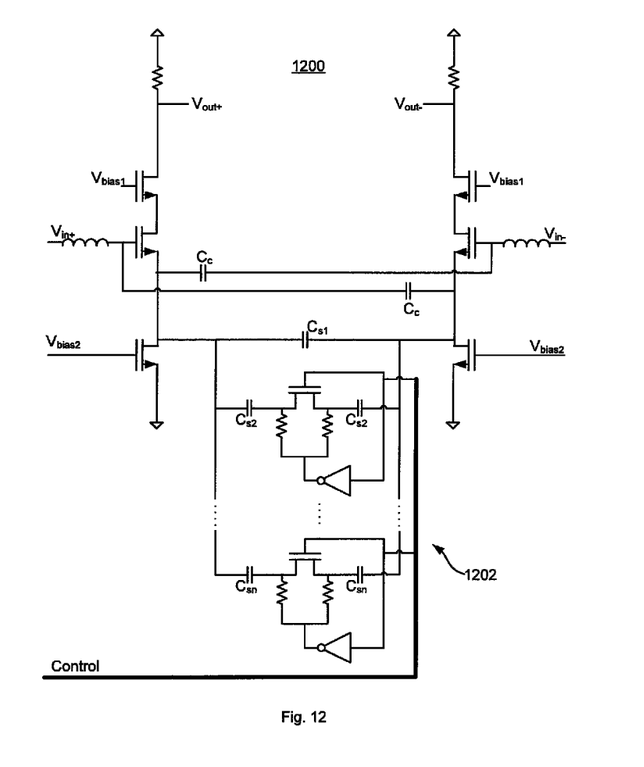
FIG. 12 illustrates a differential cross-coupled common-source amplifier having programmable differential capacitive degeneration according to an embodiment.

The above demonstrated features for differential cross-coupled common-source or common-emitter low-noise amplifiers having capacitive degeneration can as the reader understands be used in a multitude of combinations and provide great adaptability to the requirement of the application of the low-noise amplifier, at design, for handling manufacturing phenomena, or for adapting to a particular situation when up and running, and still be able to benefit from the less costly or space demanding structure, and the features in sense of power consumption and noise figures. All feasible combinations are not able to be depicted and described each in detail here, but for illustration of what can be derived from the described principles, FIG. 12 illustrates an example where a differential cross-coupled common-source amplifier 1200 having programmable differential capacitive degeneration 1202, and utilising cascoded transistors at the output. The programmable differential capacitive degeneration network will be recognised from FIG. 7, the capacitive cross-coupling will be recognised from FIGS. 1, 2 and 3, and the cascode structure is recognised as one of the alternatives given with reference to FIG. 1 The amplifier 1200 can as well be provided with a programmable capacitive cross-coupling as recognised from FIGS. 4 and 5. The amplifier 1200 can also be provided, in addition to the programmable differential capacitive degeneration network 1202, be provided with a fixed capacitive degeneration as recognised from FIGS. 1, 2 and 4, or with a programmable capacitive degeneration network as recognised from FIGS. 3 and 5. The amplifier 1200 can also be provided without the cascode arrangement. As stated above, many feasible combinations are easily derived from the above given features and principles.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A differential cross-coupled common-source or common-emitter low-noise amplifier having capacitive degeneration, wherein the low-noise amplifier comprises:
   a first capacitive cross coupling from gate or base of a first input transistor to source or emitter of a second input transistor, and a second capacitive cross coupling from gate or base of the second input transistor to source or emitter of the first input transistor; and
   a differential capacitive degeneration circuit operatively connected between source or emitter of the first input transistor and source or emitter of the second input transistor,
   wherein properties of the capacitive cross couplings and the capacitive degeneration circuits are essentially capacitive at a working frequency of the amplifier.

2. The amplifier according to claim 1, wherein at least the first and second capacitive degeneration circuits or the differential capacitive degeneration circuit each comprises a switched degeneration capacitor network.

3. The amplifier according to claim 1, wherein the first and second capacitive cross couplings each comprises a switched cross-coupling capacitor network.

4. The amplifier according to claim 3, further comprising a control unit arranged to control capacitances of the switched degeneration capacitor networks and/or the switched cross-coupling capacitor networks.

5. The amplifier according to claim 4, wherein the control unit is arranged to control the capacitances such that input impedance of the amplifier is adapted to external circuitry connected to the input of the amplifier.

6. The amplifier according to claim 5, wherein the control unit is arranged to control the capacitances such that input impedance of the amplifier is maintained by compensating for any of circuit manufacturing process variations, supply voltage variations, bias current variations, and temperature variations of the amplifier.

7. The amplifier according to claim 4, wherein the control unit is arranged to control the capacitances such that input impedance of the amplifier is adapted to working frequency of the amplifier.

8. The low-noise amplifier according to claim 1, wherein the low-noise amplifier is comprised in a radio receiver.

9. A differential cross-coupled common-source or common-emitter low-noise amplifier having capacitive degeneration, comprising:

a first capacitive cross coupling from gate or base of a first input transistor to source or emitter of a second input transistor, and a second capacitive cross coupling from gate or base of the second input transistor to source or emitter of the first input transistor;

a first capacitive degeneration circuit operatively connected to source or emitter of the first input transistor; and a second capacitive degeneration circuit operatively connected to source or emitter of the second input transistor, wherein properties of the capacitive cross couplings and the capacitive degeneration circuits are essentially capacitive at a working frequency of the amplifier.

10. A method of controlling a differential cross-coupled common-source or common-emitter low-noise amplifier having capacitive degeneration provided via at least one of switched degeneration capacitor networks and switched cross-coupling capacitor networks, wherein the method comprises controlling an input impedance of the amplifier with respect to external circuitry connected to an input of the amplifier by controlling the capacitances of at least one of:

the switched cross-coupling capacitor networks, comprising a first capacitive cross coupling from gate or base of a first input transistor to source or emitter of a second input transistor, and a second capacitive cross coupling from gate or base of the second input transistor to source or emitter of the first input transistor; and the switched degeneration capacitor networks, comprising at least one capacitive degeneration circuit operatively connected to the source or emitter of the first input transistor and the source or emitter of the second input transistor.

11. The method according to claim 10, wherein controlling the capacitances comprises controlling the capacitances to maintain the input impedance of the amplifier by compensating for any of circuit manufacturing process variations, supply voltage variations, bias current variations, and temperature variations of the amplifier.

12. The method according to claim 10, wherein controlling the capacitances comprises controlling the capacitances to adapt the input impedance of the amplifier to a working frequency of the amplifier.

13. A computer-readable medium storing a computer program comprising program instructions that, when executed by a processor of a radio receiver, causes the radio receiver to control an input impedance of the amplifier with respect to external circuitry connected to an input of the amplifier, based on controlling the capacitances of at least one of:

a switched cross-coupling capacitor network, comprising a first capacitive cross coupling from gate or base of a first input transistor to source or emitter of a second input transistor, and a second capacitive cross coupling from gate or base of the second input transistor to source or emitter of the first input transistor; and a switched degeneration capacitor network, comprising at least one capacitive degeneration circuit operatively connected to the source or emitter of the first input transistor and the source or emitter of the second input transistor.

* * * * *